(12) United States Patent
Hedlund

(10) Patent No.: US 10,759,677 B2
(45) Date of Patent: Sep. 1, 2020

(54) SELF-CONTAINED PHOTOVOLTAIC DISTILLATION APPARATUS

(71) Applicant: Nevin Hedlund, Oakbrook Terrace, IL (US)

(72) Inventor: Nevin Hedlund, Oakbrook Terrace, IL (US)

(*) Notice: Subject to any disclaimer, the term of this patent is extended or adjusted under 35 U.S.C. 154(b) by 0 days.

(21) Appl. No.: 16/424,473

(22) Filed: May 28, 2019

(65) Prior Publication Data
US 2019/0276333 A1 Sep. 12, 2019

Related U.S. Application Data

(63) Continuation-in-part of application No. 15/614,599, filed on Jun. 5, 2017, now abandoned, which is a continuation-in-part of application No. 15/379,630, filed on Dec. 15, 2016, now abandoned.

(51) Int. Cl.
| | | |
|---|---|---|
| C02F 1/14 | (2006.01) |
| B01D 5/00 | (2006.01) |
| H02S 40/10 | (2014.01) |
| H01L 31/042 | (2014.01) |
| B01D 1/00 | (2006.01) |
| C02F 1/18 | (2006.01) |
| B01L 3/00 | (2006.01) |

(52) U.S. Cl.
CPC .............. *C02F 1/14* (2013.01); *B01D 1/0035* (2013.01); *B01D 1/0064* (2013.01); *B01D 5/006* (2013.01); *B01D 5/0042* (2013.01); *C02F 1/18* (2013.01); *H01L 31/042* (2013.01); *H02S 40/10* (2014.12); *B01D 5/0027* (2013.01); *B01L 3/00* (2013.01); *Y02A 20/109* (2018.01); *Y02A 20/128* (2018.01); *Y02A 20/129* (2018.01); *Y02A 20/142* (2018.01); *Y02A 20/212* (2018.01)

(58) Field of Classification Search
CPC . C02F 1/14; C02F 1/18; B01D 1/0035; B01D 1/0064; B01D 5/0042; B01D 5/006
See application file for complete search history.

(56) References Cited

U.S. PATENT DOCUMENTS

| | | | | |
|---|---|---|---|---|
| 4,003,365 A | * | 1/1977 | Wiegand .............. | B01D 5/0066 126/640 |
| 4,210,121 A | * | 7/1980 | Stark ........................ | B01D 3/00 126/573 |

(Continued)

*Primary Examiner* — Jonathan Miller
(74) *Attorney, Agent, or Firm* — Hojka Qadeer, LLC

(57) ABSTRACT

The present disclosure describes an apparatus that may be used to generate desalinated water from a supply of untreated water using a photovoltaic cell. The front surface of the photovoltaic cell is partially enclosed to form an evaporation chamber. The front surface of the photovoltaic cell is exposed to sunlight or another light source. This exposure results in power generation by the photovoltaic cell and also heats the air in the evaporation chamber. Untreated water is subsequently introduced into the evaporation chamber. Upon contacting the heated air and the front surface of the photovoltaic cell, a portion of the untreated water evaporates to generate water vapor. The water vapor is then removed from the evaporation chamber and transported to a condensation chamber. The water vapor is cooled in the condensation chamber to yield desalinated water.

18 Claims, 2 Drawing Sheets

(56) References Cited

U.S. PATENT DOCUMENTS

| | | | | |
|---|---|---|---|---|
| 4,323,052 A * | 4/1982 | Stark | C02F 1/14 | 126/571 |
| 4,363,703 A * | 12/1982 | ElDifrawi | B01D 3/346 | 203/10 |
| 4,487,659 A * | 12/1984 | Stark | C02F 1/14 | 202/172 |
| 5,203,989 A * | 4/1993 | Reidy | B01D 5/0039 | 210/137 |
| 5,361,587 A * | 11/1994 | Hoffman | B01D 5/0042 | 62/3.2 |
| 5,650,050 A * | 7/1997 | Kaufmann | B01D 1/16 | 202/234 |
| 9,259,662 B2 * | 2/2016 | Lee | B01D 1/0035 | |
| 9,278,315 B2 * | 3/2016 | Davis | B01D 1/0035 | |
| 9,475,707 B2 * | 10/2016 | John | E03B 3/28 | |
| 9,796,602 B2 * | 10/2017 | Faidi | C02F 1/14 | |
| 9,834,455 B2 * | 12/2017 | Frolov | B01D 3/007 | |
| 2003/0150704 A1 * | 8/2003 | Posada | B01D 1/04 | 203/1 |
| 2006/0016682 A1 * | 1/2006 | Lin | B01D 5/0066 | 202/234 |
| 2008/0164135 A1 * | 7/2008 | Slook | B01D 1/0035 | 202/83 |
| 2013/0168224 A1 * | 7/2013 | Godshall | B01D 1/0035 | 203/10 |
| 2014/0360859 A1 * | 12/2014 | Faidi | C02F 1/14 | 203/10 |
| 2015/0083575 A1 * | 3/2015 | Al-Garni | B01D 1/0035 | 202/185.3 |
| 2015/0143806 A1 * | 5/2015 | Friesth | F01K 3/00 | 60/517 |
| 2015/0353379 A1 * | 12/2015 | Lee | C02F 1/14 | 203/10 |
| 2016/0114259 A1 * | 4/2016 | Muller | C02F 1/14 | 202/177 |
| 2016/0361666 A1 * | 12/2016 | Snow | C02F 1/14 | |
| 2016/0380583 A1 * | 12/2016 | Banerjee | H02S 40/22 | 136/246 |
| 2017/0275182 A1 * | 9/2017 | Alshahrani | F24S 20/30 | |
| 2018/0002194 A1 * | 1/2018 | Andersen | B01D 3/02 | |
| 2018/0079658 A1 * | 3/2018 | Gershon | C02F 1/14 | |
| 2019/0022549 A1 * | 1/2019 | Lam | B01D 1/0035 | |

* cited by examiner

SELF-CONTAINED PHOTOVOLTAIC DISTILLATION APPARATUS

CROSS-REFERENCE TO RELATED APPLICATIONS

This application is a continuation-in-part of U.S. patent application Ser. No. 15/614,599, filed on Jun. 5, 2017, which is a continuation-in-part of U.S. patent application Ser. No. 15/379,630, filed on Dec. 15, 2016, the disclosures of which are hereby incorporated in their entireties by reference.

BACKGROUND

Field of the Invention

The present disclosure relates to a photovoltaic cell used to provide power to a distillation apparatus.

Description of the Related Art

The present disclosure relates to a photovoltaic cell used to provide power to a distillation apparatus.

The need for clean drinking water is increasingly an issue as the global population increases. Many areas that lack fresh water suitable for use as drinking water have ready access to salt water, gray water, or other contaminated water sources. However, many such areas lack the infrastructure or financial resources to refine water obtained from such sources to a drinkable quality. Frequently, such areas have abundant sunlight. This unique combination has prompted the development of many solar-powered desalination systems to produce drinkable water.

Large scale photovoltaic desalination systems utilize the power generated from photovoltaic cells to boil water or to power other types of water purification systems. These systems require large up-front capital investment and operation of sophisticated technologies. Many remote communities across the globe lack sufficient resources to install and operate such systems.

Small scale or personal-sized solar-powered desalination systems attempt to focus sunlight into a small evaporation chamber. These devices use air as a medium to condense water vapor. Such systems function best under direct sunlight without inhibition by clouds, as these conditions are most suitable for evaporation of water. However, because the air is at a higher temperature, these conditions are least conducive to condensing water vapor. Thus such systems are often highly inefficient or otherwise not very effective.

U.S. Patent Application Publication No. 2016/0114259 to Muller, et al. discloses a solar-powered desalination system that uses a heating unit to further heat the impure water to be purified. U.S. Pat. No. 9,834,455 to Frolov, et al. discloses a solar-powered desalination system that uses a heat exchanger to extract residual heat from the purified water that is then used to further heat the impure water to be purified. These and other disclosed solar-powered desalination systems that may be suitable for use in some small scale or personal-sized applications are encumbered by complexity, and thus such systems may not necessarily be suitable for inexpensive mass production for use in resource-poor or remote areas.

There remains a significant need for a simple, effective small scale or personal-sized solar-powered desalination system.

SUMMARY

The present disclosure describes an apparatus that may be used to generate desalinated water from a supply of untreated water using a photovoltaic cell. The front surface of the photovoltaic cell is partially enclosed to form an evaporation chamber. The front surface of the photovoltaic cell is exposed to sunlight or another light source. This exposure results in power generation by the photovoltaic cell and also heats the air in the evaporation chamber. Untreated water is subsequently introduced into the evaporation chamber. The untreated water may preferably be stored in an untreated water chamber before introduction into the evaporation chamber. The untreated water may preferably be introduced into the evaporation chamber using a pump. Upon contacting the heated air and the front surface of the photovoltaic cell, a portion of the untreated water evaporates to generate water vapor. The untreated water is heated directly by contacting the heated air and/or the front surface of the photovoltaic cell, without the use of a separate heating unit or heat exchange unit. The water vapor is then removed from the evaporation chamber and transported to a condensation chamber. The portion of the untreated water that does not evaporate may preferably be transported back into the untreated water chamber. The water vapor is cooled in the condensation chamber to yield desalinated water. The water vapor may preferably be cooled using a cooling plate.

DETAILED DESCRIPTION OF THE ILLUSTRATED EMBODIMENTS

Figure 1:
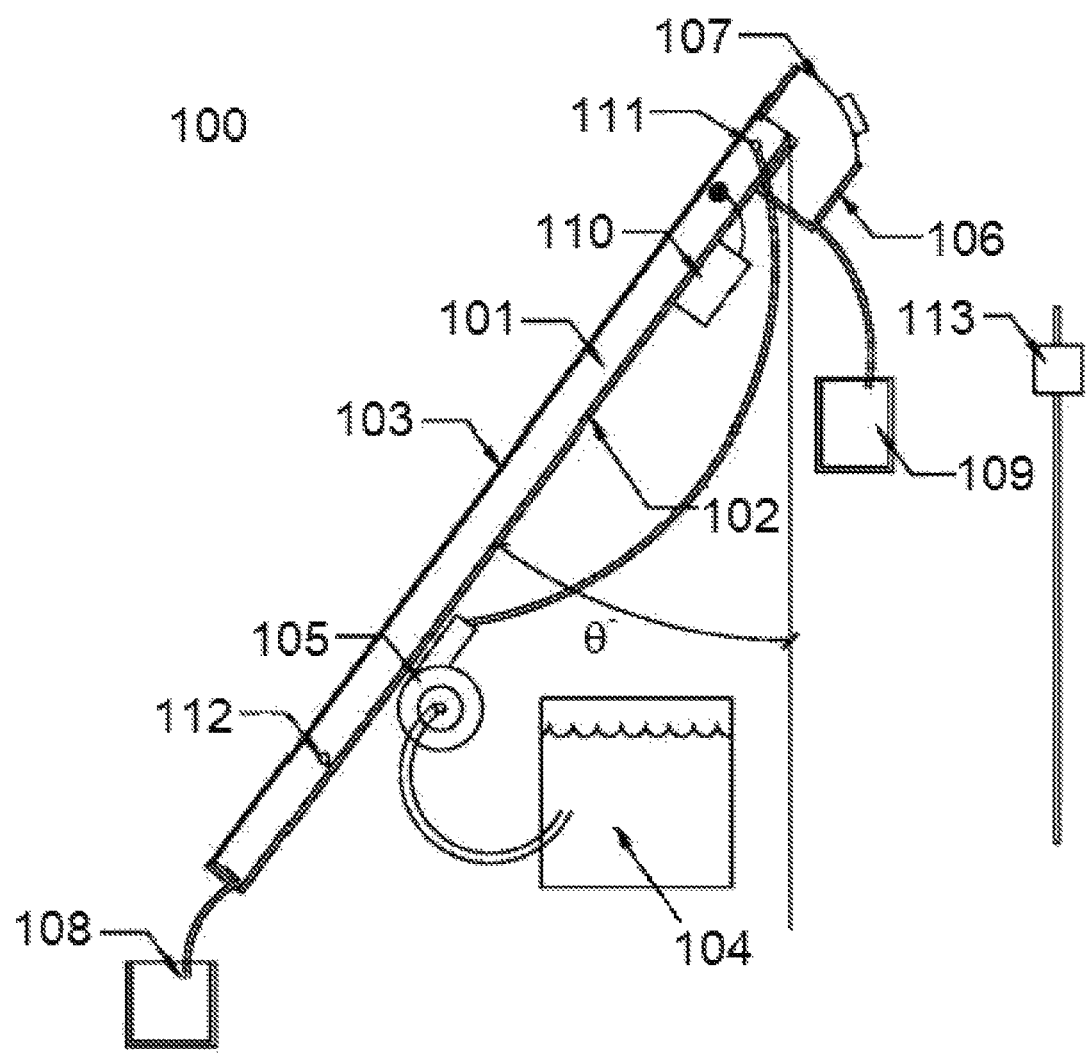
FIG. 1 shows a schematic of an embodiment of the disclosed apparatus, showing the mechanical components of the apparatus.

The present disclosure describes an apparatus that may be used to generate desalinated water from a supply of untreated water using a photovoltaic cell.

It is well established that the front surface of a photovoltaic cell generates thermal energy when exposed to sunlight. By enclosing the area around the front surface of a photovoltaic cell, the air surrounding said surface may reach temperatures in excess of 140 degrees Fahrenheit.

The front surface of the photovoltaic cell is partially enclosed to form an evaporation chamber. The front surface of the photovoltaic cell is exposed to sunlight or another light or other electromagnetic radiation source. This exposure results in power generation by the photovoltaic cell and also heats the air in the evaporation chamber. Untreated water is subsequently introduced into the evaporation chamber. The untreated water may preferably be stored in an untreated water chamber before introduction into the evaporation chamber. The untreated water may preferably be introduced into the evaporation chamber using a pump. Upon contacting the heated air and the front surface of the photovoltaic cell, a portion of the untreated water evaporates to generate water vapor. The untreated water is heated directly by contacting the heated air and/or the front surface of the photovoltaic cell, without the use of a separate heating unit or heat exchange unit. The water vapor is then removed from the evaporation chamber and transported to a condensation chamber. The portion of the untreated water that does not evaporate may preferably be transported back into the untreated water chamber. The water vapor is cooled in the condensation chamber to yield desalinated water. The water vapor may preferably be cooled using a cooling plate.

The efficiency of photovoltaic cells is known to be optimized within specific temperature ranges. If the temperature at the surface of a photovoltaic cell is above or below the optimum temperature range, the efficiency of the photovoltaic cell decreases. Thus, an additional advantage provided by the disclosed apparatus is to optimize the efficiency of the photovoltaic cell. As the photovoltaic cell is heated by incident sunlight, it heats the air and untreated water in the evaporation chamber. The water is then collected in the condensation chamber as described. This heat transfer lowers the temperature at the surface of the photovoltaic cell. By controlling the rate at which untreated water is introduced into the evaporation chamber, it is possible to maximize the efficiency of the system by maintaining surface of the photovoltaic cell at its optimum operating temperature. This ensures optimum use of available energy sources, and leads to synergy between the generation of treated water and the operation of the photovoltaic cell at peak efficiency.

In some preferred embodiments, electrical energy produced by the photovoltaic cell may preferably be used to power various components of the apparatus.

In some preferred embodiments, some of the energy produced by the photovoltaic cell may power the cooling plate used to condense the water vapor generated in the evaporation chamber.

In some preferred embodiments, some of the energy produced by the photovoltaic cell may be stored in a battery or other energy storage system. The energy stored in a battery may be used to power other components of the apparatus such as a wiper, humidistat, controller, motor, counterweight, pump, or other optional components described herein.

In some embodiments, the apparatus may further comprise a wiper, wherein the wiper may be used to remove residual deposits from the front surface of the photovoltaic cell. These residual deposits may be introduced via the untreated water and may otherwise obstruct light from reaching the front surface of the photovoltaic cell.

In some embodiments, the wiper may be operated by a motor, by using a counterweight, or by using both a motor and a counterweight. The wiper may preferably be operated according to a frequency that maximizes the difference between the energy produced by the photovoltaic cell and the energy consumed by operating the wiper.

In some embodiments, the apparatus may further comprise a humidistat, wherein the humidistat may be used to monitor and adjust the humidity and temperature within the evaporation chamber. The rate of introduction of untreated water may preferably be controlled by the humidistat to optimize performance of the apparatus by maintaining high temperature and high humidity in the evaporation chamber.

In some embodiments, the apparatus may further comprise two or more aerators, wherein at least one aerator may be used to introduce air bubbles into the untreated water stream entering the evaporation chamber and at least one other aerator may be used to allow excess air or other gases to exit the evaporation chamber to maintain equilibrium and avoid a buildup of pressure. The introduction of air bubbles into the untreated water stream will increase the surface area of contact between the heated air in the evaporation chamber and the untreated water. This results in a higher rate of evaporation.

FIG. 1 illustrates an embodiment 100 of the disclosed apparatus, showing a schematic depiction of the mechanical components of the embodiment 100. Evaporation Chamber 101 is situated between Photovoltaic Cell 102 and Glass Plate 103. Untreated Water Chamber 104 contains untreated water. Photovoltaic Cell 102 is exposed to sunlight. Subsequently, the air within Evaporation Chamber 101 is heated both by contact with the front surface of Photovoltaic Cell 102 and directly by the entering sunlight. The untreated water in Untreated Water Chamber 104 is then introduced into Evaporation Chamber 101 using Pump 105. Upon contacting the heated air and the front surface of Photovoltaic Cell 102, a portion of untreated water evaporates in Evaporation Chamber 101 to generate water vapor. The water vapor diffuses into Condensation Chamber 106 and subsequently condenses on Cooling Plate 107. The portion of untreated water that does not evaporate is transported back into Untreated Water Chamber 104 via Recirculation Reservoir 108. Desalinated water is collected in Treated Water Chamber 109. A sensor connected to Humidistat 110 monitors the humidity and temperature within Evaporation Chamber 101 and transmits this data to Humidistat 110. Humidistat 110 uses the data obtained from the sensor to adjust the humidity and temperature as necessary to optimize performance of the apparatus by maintaining high temperature and high humidity in Evaporation Chamber 101. Aerators 111 introduce air bubbles into the untreated water stream entering Evaporation Chamber 101 and allow excess air or other gases to exit Evaporation Chamber 101 to maintain equilibrium and avoid a buildup of pressure. Wiper 112 is used to remove residual deposits from the front surface of Photovoltaic Cell 102. Wiper 112 is operated by Motor and Counterweight 113. Photovoltaic Cell 102 is offset from the vertical plane by an angle of θ degrees, where θ may preferably be between about 20 and 60, more preferably between about 30 and 45, and even more preferably between about 35 and 40, and most preferably about 36 degrees.

Figure 2:
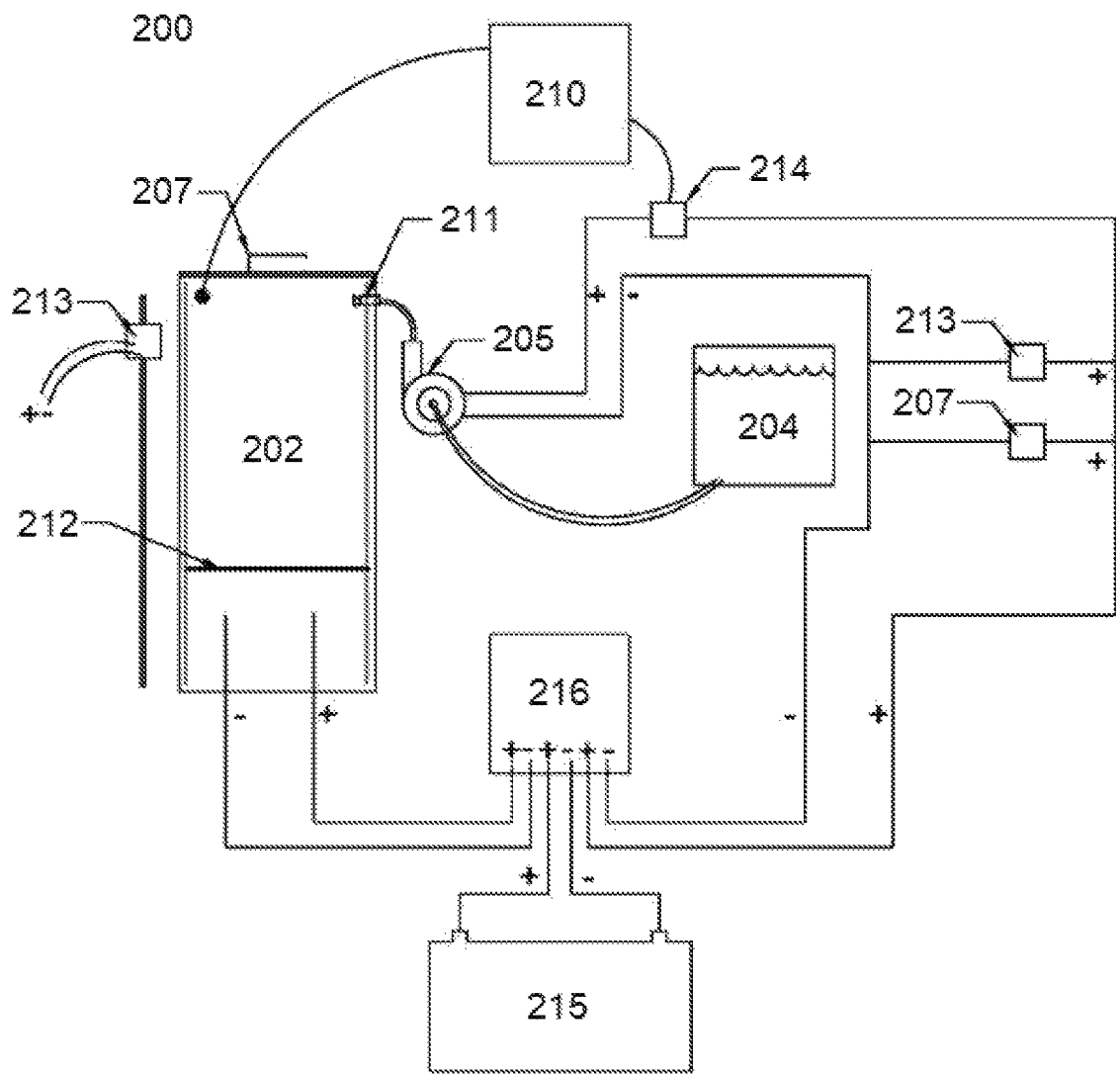
FIG. 2 shows a schematic of an embodiment of the disclosed apparatus, showing the electrical components and electrical connectivity of the apparatus.

FIG. 2 illustrates an embodiment 200 of the disclosed apparatus, showing a schematic depiction of the electrical components and electrical connectivity of the embodiment 200. Photovoltaic Cell 202 is exposed to sunlight to generate energy. Some of the energy generated is transferred to Battery 215 via Charge Control Unit 216. Battery 215 stores the energy transferred thereto for use in powering other components of the apparatus. Charge Control Unit 216 manages the distribution of energy from Battery 215 to the remaining components of the apparatus, including Pump 205, Cooling Plate 207, Humidistat 210, Aerators 211, Wiper 212, Motor and Counterweight 213. Pump 205 is used to introduce untreated water from Untreated Water Chamber 204 to the evaporation chamber (not shown). Humidistat 210 may be turned on and off using Humidistat Switch 214.

EXAMPLE

Untreated salt water with 35 ppt salt was generated using Instant Ocean. Power generated by the photovoltaic cell was used by a controller and 12 volt DC water pump to pump untreated water into the evaporation chamber. A cooling plate comprising thermoelectric modules situated between two copper plates was employed in the condensation chamber. When the cooling plate was exposed to current, the thermoelectric modules rendered one copper plate cool and the other copper plate hot. The thermoelectric modules were configured so that the cool plate was on the inside of the condensation chamber. The cool plate was used to condense water vapor generated in the evaporation chamber. The salinity of the condensed water vapor was measured and determined to be 1.1 ppt.

The previous description of the disclosed embodiments is provided to enable any person skilled in the art to make or use the invention disclosed herein. Various modifications to these embodiments will be readily apparent to those skilled in the art, and the generic principles defined herein may be applied to other embodiments without departing from the spirit or scope of the disclosure. For example, various modifications may be made to the materials used, the selection of components used, the configuration of various components, and the interaction between components. Thus, the present disclosure is not intended to be limited to the embodiments shown herein but is to be accorded the widest scope consistent with the principles and novel features disclosed herein. All references cited herein are expressly incorporated by reference.

What is claimed is:

1. A distillation apparatus comprising:
   a. a photovoltaic cell that has a front surface configured for exposure to light,
      wherein the front surface of the photovoltaic cell is heated when it is exposed to light;
   b. an evaporation chamber that contains air therein,
      wherein the front surface of the photovoltaic cell forms one side of the evaporation chamber, and
      wherein the air is heated when the front surface of the photovoltaic cell is exposed to light; and
   c. a condensation chamber situated adjacent to the evaporation chamber;
   wherein the apparatus allows direct heating of untreated water without the use of a heating unit or a heat exchange unit;
   wherein the apparatus does not include a heating unit or a heat exchange unit;
   wherein the untreated water is heated by the heated air and the heated front surface of the photovoltaic cell; and
   wherein the apparatus is used to generate treated water from the untreated water that is heated using the apparatus.

2. The distillation apparatus of claim 1, wherein the apparatus is sealed to prevent a substantial influx or outflow of air from the apparatus.

3. The distillation apparatus of claim 1, wherein the condensation chamber further comprises a cooling plate.

4. The distillation apparatus of claim 2, wherein the condensation chamber further comprises a cooling plate.

5. The distillation apparatus of claim 4 further comprising an untreated water chamber, wherein untreated water stored in the untreated water chamber is introduced into the evaporation chamber by a pump.

6. The distillation apparatus of claim 5 further comprising a treated water chamber, wherein the treated water chamber is used to collect treated water.

7. The distillation apparatus of claim 6, wherein untreated water enters the evaporation chamber substantially close to the top of the evaporation chamber, and wherein untreated water that does not evaporate is collected in a recirculation reservoir situated substantially close to the bottom of the evaporation chamber, wherein said untreated water that does not evaporate is transported from the recirculation reservoir to the untreated water chamber.

8. The distillation apparatus of claim 4, wherein the cooling plate comprises one or more thermoelectric modules situated between two metal plates.

9. The distillation apparatus of claim 8, wherein the metal plates are copper plates.

10. The distillation apparatus of claim 7, wherein the untreated water comprises salt water or gray water.

11. The distillation apparatus of claim 7 further comprising a battery, wherein the battery is configured to store energy generated by the photovoltaic cell.

12. The distillation apparatus of claim 7 further comprising a humidistat, wherein the humidistat is configured to control the rate at which untreated water enters the evaporation chamber.

13. The distillation apparatus of claim 7 further comprising two or more aerators, wherein at least one aerator is used to introduce air bubbles into the stream of untreated water that enters the evaporation chamber and at least one other aerator is used to allow excess air or other gases to exit the evaporation chamber to maintain equilibrium and avoid a buildup of pressure.

14. The distillation apparatus of claim 7 further comprising a wiper, wherein the wiper is configured to clean the front surface of the photovoltaic cell at a specified frequency.

15. The distillation apparatus of claim 14, wherein the wiper is operated by a motor, by using a counterweight, or by using both a motor and a counterweight.

16. The distillation apparatus of claim 11 further comprising a humidistat, wherein the humidistat is configured to control the rate at which untreated water enters the evaporation chamber.

17. The distillation apparatus of claim 16 further comprising two or more aerators, wherein at least one aerator is used to introduce air bubbles into the stream of untreated water that enters the evaporation chamber and at least one other aerator is used to allow excess air or other gases to exit the evaporation chamber to maintain equilibrium and avoid a buildup of pressure.

18. The distillation apparatus of claim 17 further comprising a wiper, wherein the wiper is configured to clean the front surface of the photovoltaic cell at a specified frequency.

* * * * *